(12) United States Patent
Cook

(10) Patent No.: US 11,153,522 B2
(45) Date of Patent: Oct. 19, 2021

(54) IMAGING SYSTEM INCLUDING DIGITAL DUAL SPEED READOUT INTEGRATED CIRCUIT (ROIC)

(71) Applicant: RAYTHEON COMPANY, Waltham, MA (US)

(72) Inventor: Robert L. Cook, Plano, TX (US)

(73) Assignee: RAYTHEON COMPANY, Waltham, MA (US)

( * ) Notice: Subject to any disclaimer, the term of this patent is extended or adjusted under 35 U.S.C. 154(b) by 41 days.

(21) Appl. No.: 16/699,249

(22) Filed: Nov. 29, 2019

(65) Prior Publication Data

US 2021/0168315 A1   Jun. 3, 2021

(51) Int. Cl.
*H04N 5/378* (2011.01)
*H01L 27/146* (2006.01)
*H04N 5/345* (2011.01)
*H04N 5/3745* (2011.01)

(52) U.S. Cl.
CPC ....... *H04N 5/378* (2013.01); *H01L 27/14609* (2013.01); *H04N 5/3454* (2013.01); *H04N 5/37452* (2013.01)

(58) Field of Classification Search
CPC .. H04N 5/378; H04N 5/3454; H04N 5/37452; H01L 27/14609
See application file for complete search history.

(56) References Cited

U.S. PATENT DOCUMENTS

| 5,737,075 A | 4/1998 | Koch et al. |
| 8,704,144 B2 | 4/2014 | Elliott et al. |
| 9,635,287 B2 | 4/2017 | Wyles et al. |
| 2012/0038786 A1* | 2/2012 | Kelly ................ G02B 26/0833 348/222.1 |

OTHER PUBLICATIONS

International Search Report and Written Opinion for International Application No. PCT/US2020/050154; Application Filing Date Sep. 10, 2020; Dated Oct. 28, 2020 (13 pages).
Pratt et al., "Hadamard transform image coding" Proceedings of the IEEE 57.1 (Jan. 1969): pp. 58-68.

* cited by examiner

*Primary Examiner* — Twyler L Haskins
*Assistant Examiner* — Fayez A Bhuiyan
(74) *Attorney, Agent, or Firm* — Cantor Colburn LLP

(57) ABSTRACT

An imaging system includes a Read-Out Integrated Circuit (ROIC) configured to receive high spatial resolution imagery having a detected amount of energy from a detection device. The ROIC includes a mask generator and a high-resolution image decode. The mask generator applies a pixel mask to the high spatial resolution imagery so as to generate compressed high spatial resolution imagery that preserves the detected amount of energy. The high-resolution image decoder receives the compressed high spatial resolution imagery and decompresses the compressed high spatial resolution imagery and obtain the high spatial resolution imagery having a detected amount of energy.

13 Claims, 5 Drawing Sheets

IMAGING SYSTEM INCLUDING DIGITAL DUAL SPEED READOUT INTEGRATED CIRCUIT (ROIC)

BACKGROUND

The present disclosure relates to imaging system, and more particularly, to high spatial resolution (HSR) imaging systems.

High spatial resolution imaging systems are capable of distinguishing between objects or targets that are located within a small proximity to each other. In addition, HSR imaging systems have been developed that implement a single sensor, which can simultaneously provide high-resolution imagery and low-resolution imagery. In this arrangement, high frame rates (e.g., about 960 hertz) are used to detect extremely fast or sudden events such as pulsed light or light flashes (typically requiring low resolution for detect), while low frame rates (e.g., 60 hertz) are used to provide high resolution imagery.

SUMMARY

According to a non-limiting embodiment an imaging system includes a Read-Out Integrated Circuit (ROIC) configured to receive high spatial resolution imagery having a detected amount of energy from a detection device. The ROIC includes a mask generator and a high-resolution image decode. The mask generator applies a pixel mask to the high spatial resolution imagery so as to generate compressed high spatial resolution imagery that preserves the detected amount of energy. The high-resolution image decoder receives the compressed high spatial resolution imagery and decompresses the compressed high spatial resolution imagery and obtain the high spatial resolution imagery having a detected amount of energy.

According to yet another non-limiting embodiment, a method of processing imagery data comprises receiving, via a Read-Out Integrated Circuit (ROIC), a high spatial resolution imagery having a detected amount of energy from a detection device, and applying, via the ROIC, a pixel mask to the high spatial resolution imagery so as to generate compressed high spatial resolution imagery that preserves the detected amount of energy. The method further comprises receiving, via a high-resolution image decoder; the compressed high spatial resolution imagery and decompressing, via the high-resolution image decoder, the compressed high spatial resolution imagery to obtain the high spatial resolution imagery having a detected amount of energy.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Known HSR imaging systems capable of simultaneously providing high-resolution imagery and low-resolution imagery employ analog dual speed ROICs that includes one or more compressive sensing (CS) components that allows the ROIC to generate compressed image data. Conventional dual speed ROICs, however, sample only a portion of the pixel data during spatial data integration, while still outputting 2 k×2 k 16+ data at about 1 kHz. Not only is a portion of the energy captured (e.g., only half the energy) in order to sample a portion of the pixel rather than the entire pixel data, the processed output data still creates significant bandwidth concerns.

One or more non-limiting embodiments described herein provides an imaging system that implements a single sensor and a digital dual speed ROIC capable of capturing the full amount of energy during the integration period, while significantly reducing bandwidth (e.g., by at least about 4 times compared to dual speed analog ROICs). For example, the digital dual speed ROIC described herein is capable of providing a large focal plane that captures images at a high frame rate. The captured image is output as a compressed (e.g., encoded) image that reduces bandwidth (e.g., by a 4:1 reduction). The compressed output data can then be reconstructed (e.g., decoded) using a targeted range of data frames (e.g., the previous 8 frames of data) to obtain a high resolution image appearing as it would when captured at low frame rates.

Figure 1:
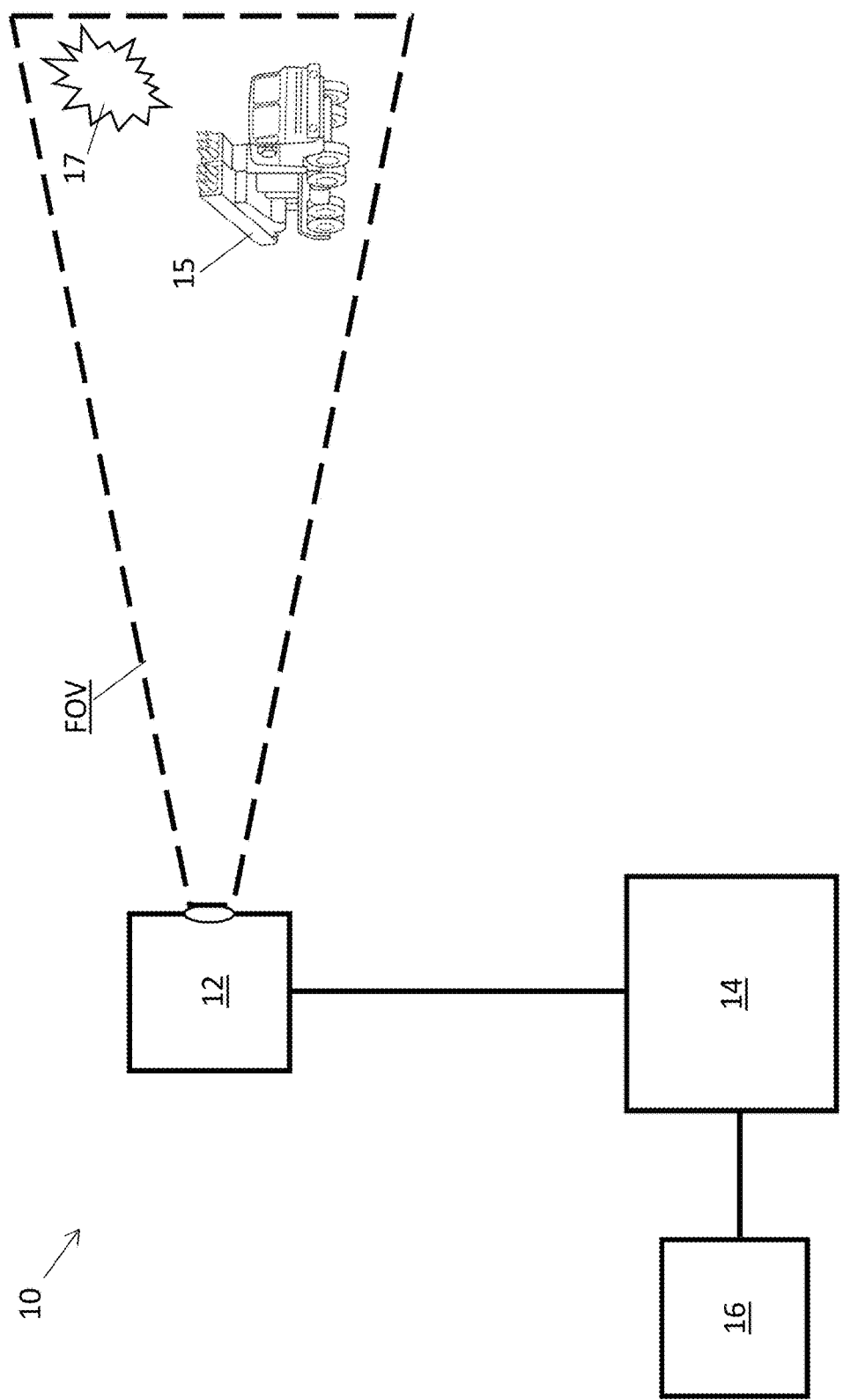
FIG. 1 is a block diagram of an imaging system according to a non-limiting embodiment.

With reference now to FIG. 1, a sensor system 10 having an image sensor 12 having a given field of view (FOV). The image sensor 12 collects image information for processing by a signal processing module 14 to provide video on a display 16 to facilitate identification of events of interest contained in the collected sensor information. The image information can include, for example, an object 15 (e.g., vehicle) and/or a light burst or flash event 17 present in the FOV. It is understood that the sensor system 10 can be placed on any practical vehicle, satellite, or stationary structure, or can be configured to be carried by a user.

As described more fully below, the sensor system 10 simultaneously provides lower-resolution imagery at high frame rates (e.g., a 512×512 low-resolution images at about 960 Hz to about 1 kHz), as well as high-resolution imagery at lower frame rates (e.g. 2 k×2 k high-resolution images at about 60 Hz). The lower frame rate imagery provides standard high-resolution scene images. The higher frame rate imagery can be used to identify pulsed light, for example. In one or more non-limiting embodiments, the sensor system 10 can detect weapons fire in a scene by measuring the temporal characteristics of relatively fast events 17, such as muzzle flashes.

It will be readily appreciated that any practical type of sensor capable of collecting pixel-based image information can be used. In one particular application, an electro-optical imaging sensor is used for infrared and/or visible-light imaging. The sensor includes an array of pixels, which can be arranged in columns and rows (see FIG. 4). In one embodiment, information from neighboring pixels can be combined in order to reduce data rates. For example, a superpixel SP can be from a 4×4 aggregation of neighboring pixels. It is understood that any practical number of neighboring pixels can be used to meet the needs of a particular application.

In an exemplary embodiment, a sensor system includes a subframe averager (SFA) circuit for each pixel. The SFA circuit includes a switched capacitor, low-pass filter which improves performance by reducing noise. The SFA circuit operates at a relatively high rate, e.g., many times higher than typical video frame rates. In one particular embodiment, a sensor system includes a focal plan array (FPA) having a 1K×1K array with a 30 Hz output and a 256 by 256 array of aggregated 4×4 pixel groups with a 600 Hz event indicator output, which is simultaneous with the 30 Hz output.

As known in the art, a focal-plane array (FPA) refers to an image sensing device comprising an array (typically rectangular) of light-sensing pixels at the focal plane of a lens. FPAs are commonly used for imaging purposes, e.g. taking pictures or video imagery, but can also be used for non-imaging purposes. FPAs operate by detecting photons at particular wavelengths and generating an electrical charge, voltage, or resistance in relation to the number of photons detected at each pixel. This charge, voltage, or resistance is measured, digitized, and used to construct an image of the object, scene, or phenomenon that emitted the photons.

Figure 2:
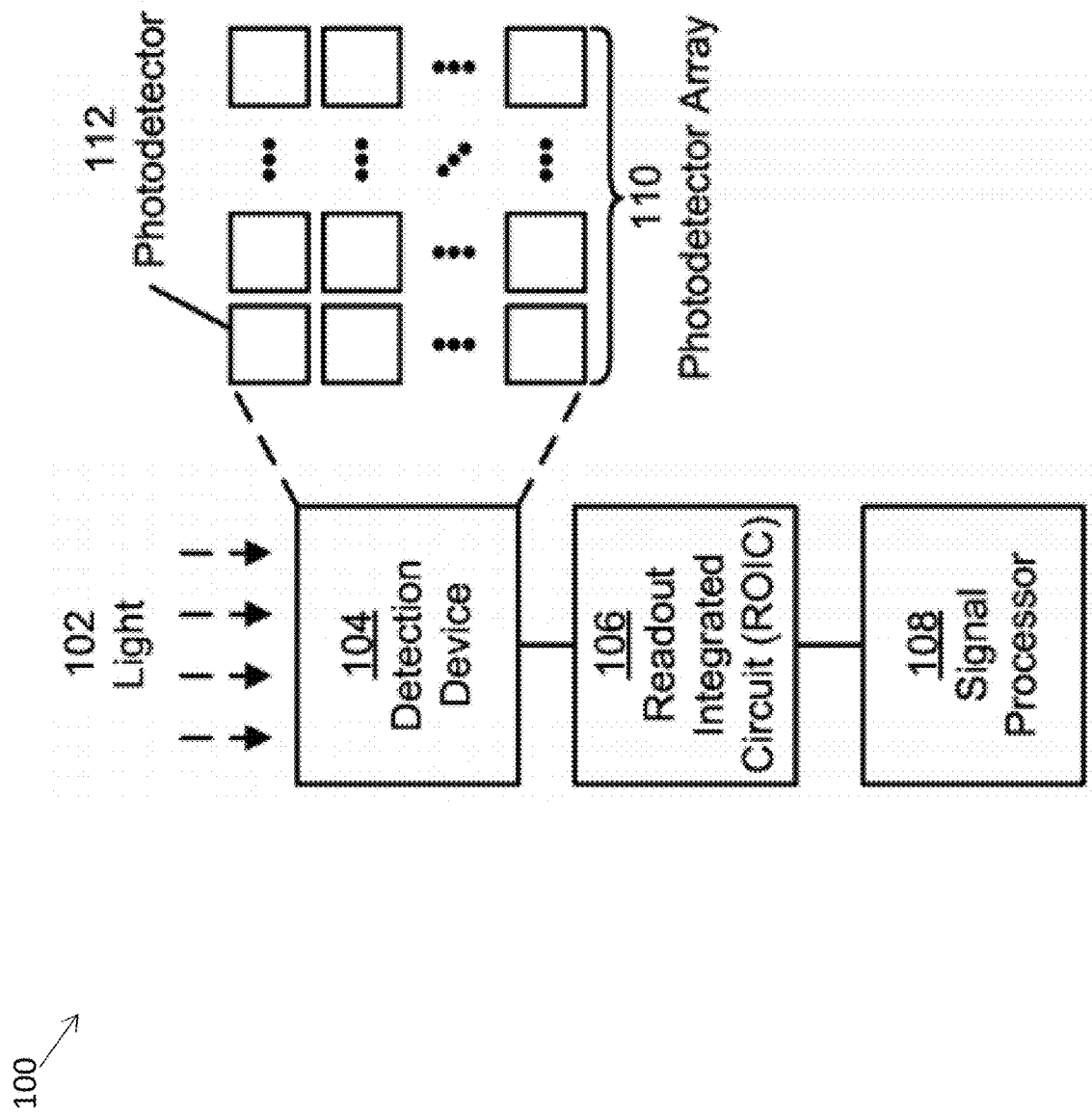
FIG. 2 is a block diagram of one example of a focal plane array (FPA) imaging system according to aspects of the invention.

Turning to FIG. 2, a block diagram illustrating an example FPA imaging system 100. The FPA imaging system 100 includes a detection device 104 that includes a plurality of photodetectors 112 arranged in a photodetector array 110 and configured to receive incident light 102. The FPA imaging system 100 further comprises an ROIC 106 and a signal processor 108.

In one embodiment, the detection device 104 employs a plurality of photodetectors 112 in the photodetector array 110 to receive the incident light 102. The photodetectors 112 are photo-sensitive devices that may accumulate charge (e.g., in a charge coupled device (CCD) sensor) or produce a current and/or voltage (e.g., in a complementary metal oxide semiconductor (CMOS) sensor) in response to light incident upon the photodetector 112. The photodetector 112 may include, for example, a photovoltaic detector, a barrier device detector, a position sensitive detector (PSD), or other suitable detector. Each photodetector 112 may be individually addressed based on a unique address (e.g., row and column value). It is appreciated that photodetector array 110 may include digital pixels that provide digitized image data to, for example, the ROIC 106.

The ROIC 106 is coupled to the detection device 104 to receive high spatial resolution imagery from the detection device 104. More specifically, the ROIC 106 receives the accumulated charge or current and/or voltage signals and digitize the received information for receipt by the signal processor 108. The ROIC 106 may output the received information representative of the image to, for example, the signal processor 108. In one or more embodiments, the ROIC 106 is controlled by one or more external devices (e.g., signal processor 108) to receive various control signals. The control signal can control, for example, CR, block sizes, and/or sample rates.

The ROIC 106 includes one or more CS components. Accordingly, the ROIC 106 can generate compressed image data representative of an image captured by the photodetectors 112 consistent with various CS techniques and provide the compressed image data to, for example, the signal processor 108. By integrating the CS component within the ROIC 106, a design is achieved wherein the sampling and compression of the photodetectors 112 is performed simultaneously, which permits a higher number of photodetectors 112 to be utilized without a proportional increase in power and bandwidth to capture and transmit image data. Example implementations of the ROIC 106 with a CS component(s) are described further below with reference to FIG. 3.

The signal processor 108 is coupled to the ROIC 106 and receives digitized information from the ROIC 106 representative of the incident light 102 on the detection device 104. The digitized information received from the ROIC 106 may include, for example, compressed image information consistent with various compressive sensing methods. The signal processor 108 may be a generic processor or a specialized processor (e.g., a digital signal processor). The signal processor 108 may include, for example, other functional components such as a video processing unit, a graphics processing unit, an embedded processor, a single instruction, multiple data digital signal processor (SIMD DSP), and internal memory (not shown). It is appreciated that the functionality of the signal processor 108 may be included within and/or performed by ROIC 106.

Figure 3:
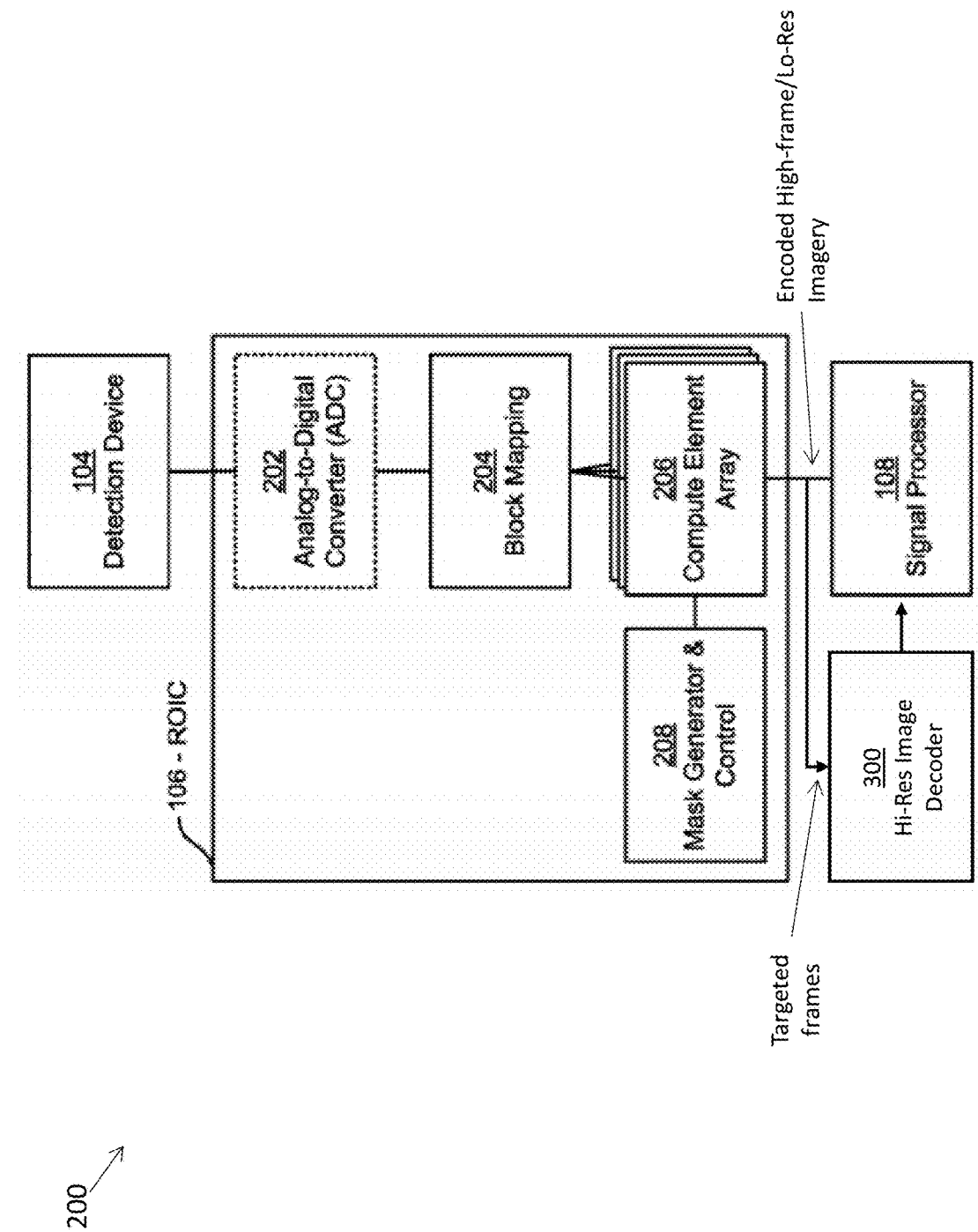
FIG. 3 is a block diagram of an example FPA imaging system according to a non-limiting embodiment.

Referring to FIG. 3, an example of an FPA imaging system 200 with various CS components integrated into the ROIC 106 is illustrated according to a non-limiting embodiment. The example FPA imaging system 200 includes a detection device 104, an ROIC 106, a signal processor 108 and a high-resolution image decoder 300.

The detection device 104 provides analog photodetector values representative of the intensity and/or characteristics of the light incident on the respective photodetector (e.g., photodetector 112). In these examples, the ROIC 106 may digitize the analog photodetector values received from the detection device 104 (via an analog-to-digital converter (ADC)) to generate digital pixel values. The ADC 202 may include a column ADC constructed to, for example, digitize one or more columns of analog photodetector values at a time. It is appreciated that the ADC 202 may be omitted in imaging system 200 that implement detection devices 104 that output digital pixel values of a detected image.

The ROIC 106 includes various integrated CS components to compress the image data provided by detection device 104. The CS components integrated in the ROIC 106 include, but are not limited to, ADC 202, a block mapping component 204, a compute element array 206, and a mask generator and control component 208. Any one of the ADC 202, block mapping component 204, compute element array 206, and mask generator and control component 208 can be constructed as an electronic hardware controller that includes memory and a processor configured to execute algorithms and computer-readable program instructions stored in the memory. In addition, the ADC 202, block mapping component 204, compute element array 206, and mask generator and control component 208 can all be embedded or integrated in a single controller.

The block mapping component 204 directs digital pixel values (e.g., received from the detection device 104 and/or the ADC 202) to the appropriate compute element within the compute element array 206. The block mapping component 204 may, for example, divide the digital pixel values into a set of blocks and direct each block (or a portion of each block) to a particular compute element of the compute element array 206. The block mapping component 204 may include, for example, a programmable manifold that may be reconfigured to change the target compute element for a given block (or a portion thereof) of digitized pixel values. Dividing the pixel values into a set of blocks and directing each block into a compute element may enable the ROIC 106 to compress multiple sub-sections of an image simultaneously and, thereby, reduce the time required to compress an image. It should be appreciated that the image may be divided into multiple sub-sections without a block mapping component 204. The interconnections between the detection device 104 or the ADC 202 and the compute element array 206 may be hardwired to output digital pixel values in a particular location of an image to a preselected compute element of the compute element array 206.

The compute element array 206 generates coded aggregates based on measurement matrices and pixel values. Each compute element in the compute element array 206 may include, for example, a dedicated block of memory coupled to a logic core. The dedicated block of memory may include, for example, a register file implemented as 2-port static random access memory (SRAM) with one read port and one write port. Employing 2-port SRAM may improve compressing speed by enabling read and write operations to be performed simultaneously. The dedicated block of memory in each compute element may store the aggregate codes for each measurement matrix of the set of measurement matrices for generating a computational pixel mask. In one or more non-limiting embodiments, the computational pixel mask is generated according to a Hadamard matrix.

In one or more non-limiting embodiments, the ROIC 106 receives control signals to dynamically vary the CR and/or sample rate based on the content of the reconstructed image. For example, the CR of the ROIC 106 may be adjusted to accommodate a higher outputted sample rate of the image, or a region of interest (ROI) in the image. As discussed above, a CR of 10 is a 90% reduction of bandwidth. Thus, adjusting the CR of the overall FPA or of particular regions of the FPA enables highly flexible bandwidth management. In one example, the CR (and accordingly, the block size) of only certain regions of interest may be altered while over other regions a constant CR is maintained. In this example, an image reconstruction engine may generate reconstructed images by reusing previously reconstructed images of low-sample rate regions in combination with data related to high-sample rate ROI. Stated differently, the image reconstruction engine may generate images based on regions with different rates of sampling by reusing reconstructed images from regions which are sampled less frequently.

In this example, the ROIC 106 could operate on lower clock frequencies and still generate high frame rates. For example, the system may have a clock rate of 25 MHz and generate frames at a rate in excess of 1 KHz. The logic core coupled to each block of dedicated memory may receive the mask values and/or the pixel values in addition to performing the addition and/or subtraction operations to produce the coded aggregates. The logic core may include, for example, circuitry capable of performing addition and/or subtraction of two binary values as is known to those skilled in the art. In at least one example, the logic core includes an arithmetic logic unit (ALU) to perform, for example, the addition and/or subtraction operations for two binary values. It is appreciated that multiple dedicated blocks of memory may share a single logic core in some implementations.

It is appreciated that the measurement matrix may contain non-random values. For example, a non-random vector of measurement codes may enable an emphasis on low frequency sampling in initial measurements. In this example, low frequency sampling may provide an initial image with reduced resource demands on the ROIC. Further, low frequency sampling may indicate the approximate "sparseness" of the sampled image and be used in subsequent calculations of, for example, photodetector group size, measurement code randomness, etc.

It will be understood by those skilled in the art, given the benefit of this disclosure, that the ROIC with compressive sensing greatly reduces bandwidth by a substantial factor. For example, a CR of 10 can reduce the required bandwidth to represent or transmit the compressed image by 90%. For certain architectures, power consumption reduction of similar factors is possible (e.g., fewer digital line drivers are required). In other cases, it may be possible to increase the overall focal plane frame rate with negligible impact on image resolution. Such reduced bandwidth requirements may be critical for implementation of compact video storage and wireless transmission.

The size of the blocks may be selected based on any number of design parameters including, for example, desired compression rate (CR), desired latency of the reconstructed image, and/or hardware constraints of the ROIC 106. As used herein, CR is defined as the ratio between uncompressed data size and compressed data size, and can be determined by the number of pixel values summed together. For example, if the original size of an image is 1000 Mbytes and the compressed size is 100 Mbytes, the CR is 10 (1000 Mbytes/100 Mbytes=10). In some examples, the number of photodetectors 112 included in each block may be scaled up. For example, the block size may be set equal to the same size as the photodetector array 110. In other examples, the blocks may be scaled to a size which optimizes the CR and is smaller than the full size of the photodetector array 110. For example, a 256×256 block size may enable a CR of 10 without significant loss of image quality. Employing block sizes smaller than the photodetector array 110 may also enable parallel compression of the individual photodetector groups by the ROIC 106 and, thereby, reduce the computation time to compress an image. The reduction of compression times may allow the ROIC 106 to, for example, compress frames in a live video stream.

Figures 4, 5:
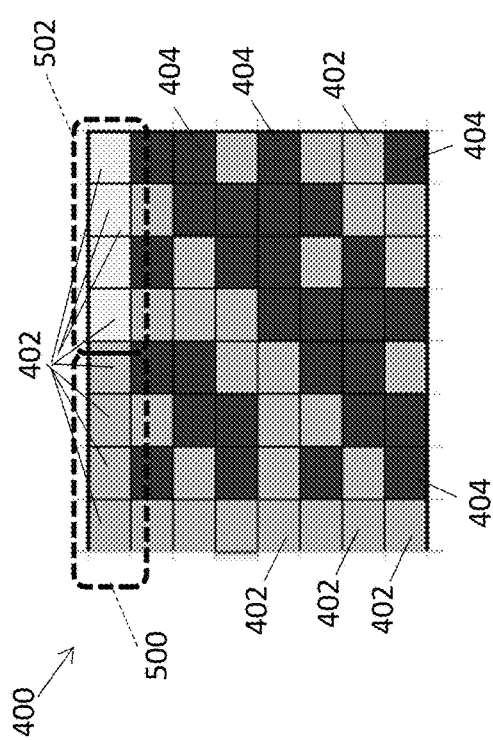
FIG. 4 is an example of a pixel mask applied to a number of pixels generated by photodetector array according to a non-limiting embodiment.
FIG. 5 indicates a selected number of pixels in a row of the pixel mask to processed separately from the remaining pixels in the row according to a non-limiting amount.

Turning to FIG. 4, an example of a pixel mask 400 for encoding a high-frame/low resolution image. The pixel mask 400 is defined by a plurality of measurement codes arranged in a plurality of columns and rows to define a grid. The measurement codes include positive value codes 402 (e.g., ⅛) and a negative value codes 404 (e.g., −⅛). Each column represents a pixel (Pn) of and each row represents a frame (Fn).

The pixel mask 400 is generated according to a Hadamard matrix. A Hadamard matrix is a square matrix whose entries are either positive (+) or negative (−) and whose rows are mutually orthogonal. In other words, each pair of rows in the Hadamard matrix represents two perpendicular vectors, while in combinatorial terms, it means that each pair of rows has matching entries in exactly half of their columns and mismatched entries in the remaining columns. The n-dimensional parallelotope spanned by the rows of an n×n Hadamard matrix has the maximum possible n-dimensional volume among parallelotopes spanned by vectors whose entries are bounded in absolute value by 1.

The Hadamard matrix can be applied to generate an encoded or compressed image stream. The Hadamard matrix effectively maps the positive value codes 402 and the negative value codes 404 for each frame. A reverse Hadamard transform (also referred to as an inverse Hadamard matrix) can then be applied to a number of encoded frames to decode or reconstruct the low frame rate/high-resolution imagery. In this manner, a large focal plane can be employed to reduce the required bandwidth from the ROIC by 4:1, while preserving high resolution imagery and providing high frame rate imagery.

The compute element array 206 processes the negative values (e.g., −⅛) of the Hadamard matrix by performing a subtraction operation to determine the coded aggregate in instances where the measurement matrix value is a "−⅛." In these examples, the pixel values may be represented as two's complement values and the compute element array 206 may perform the subtraction operation by inventing (e.g., flipping) the bits and adding one to make the pixel value negative and subsequently adding the negative pixel value to the running total of the coded aggregate.

The measurement matrices employed by the compute element array 206 may be generated and applied to the high frame rate/low-resolution imagery by the mask generator and control component 208. The mask generator and control component 208 may generate suitable masks by any of a variety of mechanisms. For example, the mask generator and control component 208 can retrieve the Hadamard matrix from memory as appropriate.

Turning to FIG. 5, at least one non-limiting embodiment utilizes a unique Hadamard matrix 400 that reduces the video output bandwidth requirements of imaging system 200. More specifically, the Hadamard matrix 400 defines at least one row (i.e., frame F1) where each pixel (P1-P8) has a positive measurement value code (e.g., ⅛). Therefore, a first half of pixels 500 (e.g., pixels P1-P4) in frame F1 will be summed separately from a second half of pixels 502 (P5-P8) in frame F1. The sum of the pixel group 500 (e.g. P1-P4) will be stored in a positive value output field while the sum of the remaining pixel group 502 (P5-P8) will be stored in a negative value output field. In this manner, the number of bits required in the positive value output filed is reduced by 3-bits, thereby reducing the overall bandwidth, e.g., a bandwidth reduction of 4:1.

Figure 6:
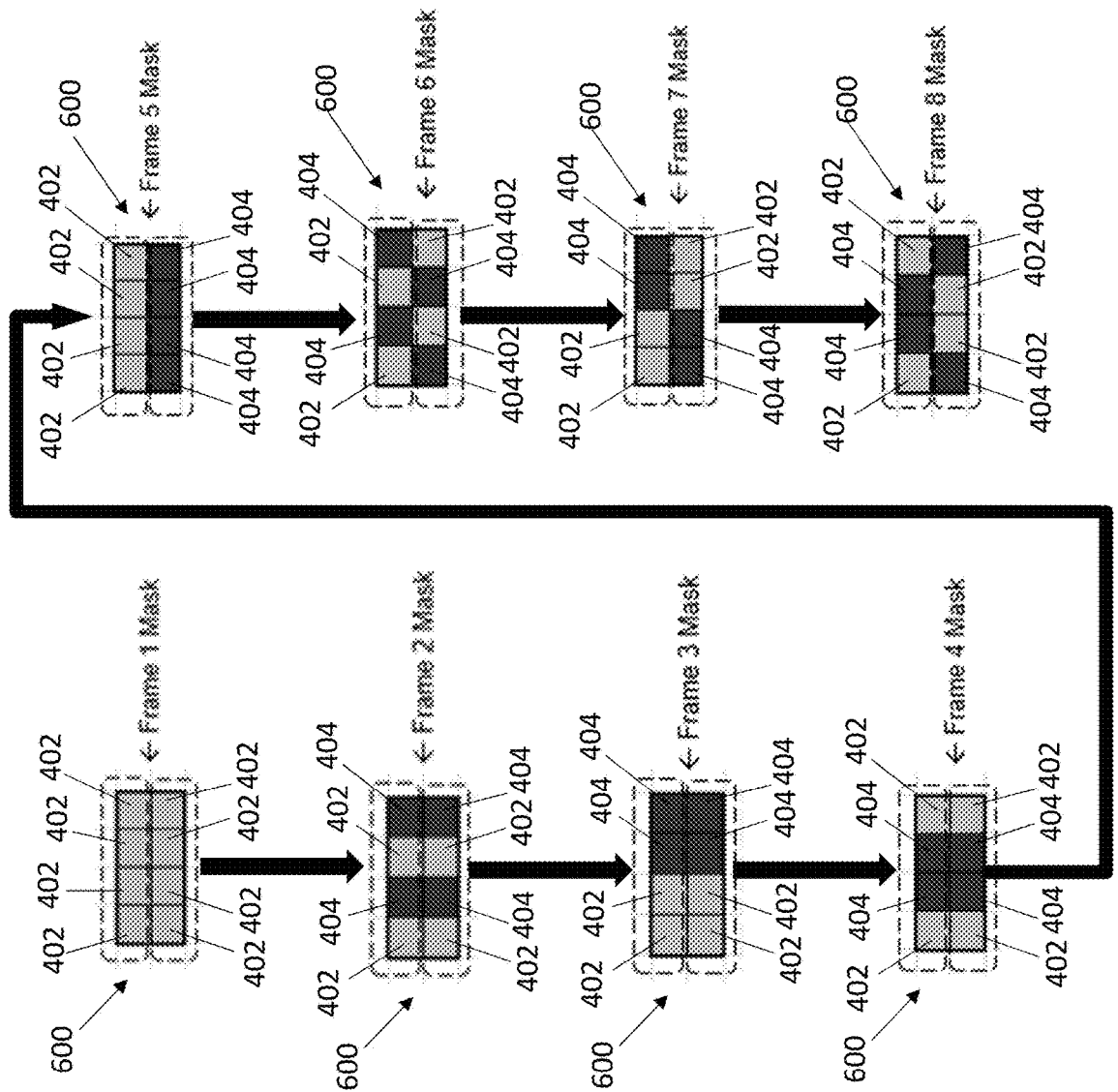
FIG. 6 illustrates a process of encoding eight sequential frames based on a Hadamard matrix according to another non-limiting embodiment.

Turning now to FIG. 6, while also still referring to FIG. 5, a process of encoding 8 sequential frames according to the Hadamard matrix 500 is illustrated according to another non-limiting embodiment. For example, illustrates an output of a first frame of pixels (e.g., from the compute element 206). Rather than subtracting the negative values in a given row of the computational matrix from the positive values the row to output a single value that represents the eight individual pixels in a given frame, each row of the Hadamard matrix 500 is represented by a 4×2 pixel matrix 600 so as to provide an 8:2 compression matrix.

More specifically, each frame includes the first and second pixels groups 500 and 502 (see FIG. 5) to generate a 4×2 pixel matrix 600 that represents 4 pixels of the Hadamard matrix 500. For each group of pixels 500 and 502 included in the 4×2 pixel matrix 600, the positive value pixels are summed together to generate a first summed pixel value, while the negative values are summed together to generate a second summed pixel value. The first and second summed pixel values represent an encoded frame of the compressed high spatial resolution imagery. In the example shown in FIG. 6, eight sequential frames are used to generate a compressed high spatial resolution image stream. Two two summed pixels represent the encoding of the eight pixels that went into their sum. Eight frames of summed pixels values are utilized to generate the compressed high spatial resolution image stream. Accordingly, the two sums are the low resolution version of the original 8 pixels. Further, each group provides a value such that a total of two summed pixel values are output for each row of the Hadamard matrix 500 instead of eight values for each row of the Hadamard matrix 500. In this manner, the image size is effectively reduced or compressed from 2048×2048 to 512×1024. The 512×2048 is effectively a spatially compressed image that contains 100% of the scene energy. The 100% of the collected scene energy is preserved at the full frame rate (e.g., 1 kHz).

Referring again to FIG. 3, the spatially compressed image is output to the signal processor 108 and the high-resolution image decoder 300. Any one of the signal processor 108 and the high-resolution image decoder 300 can be constructed as an electronic hardware controller that includes memory and a processor configured to execute algorithms and computer-readable program instructions stored in the memory. In addition, the signal processor 108 and the high-resolution image decoder 300 can be embedded or integrated in a single controller.

The signal processor 108 can process the spatially compressed image in various manners. For example, the signal processor 108 can analyze the spatially compressed image and compressed image information, send the compressed image information to an external system, and/or direct various components of the FPA imaging system. In this manner, the higher frame rate imagery provided by the spatially compressed image and compressed image information can be used to detect relatively fast pulsed light events, and measuring the temporal characteristics of these relatively fast events 17 to identify weapons fire in a scene (see FIG. 1).

The high-resolution image decoder 300 stores the reverse Hadamard transform algorithm (i.e., the inverse Hadamard matrix), which decodes the spatially compressed image and effectively decompresses and reconstructs the high-resolution scene imagery having 100% of the scene energy captured at the full frame rate (e.g., 1 kHz). To decode (i.e., decompress) the compressed image, the sum of the output values are multiplies by the Hadamard matrix and added together producing the sum values. These values are then divided by 8 (or multiplied by ⅛) to produce the original 8 values.

The high-resolution scene imagery provides a higher image quality compared to the encoded high-frame rate/low-resolution imagery, which allows for detecting increased details of scene and allows for analyzing and identifying scene objects 15 in greater detail.

As described herein, one or more embodiments described herein provide an imaging system that implements a single sensor and a digital dual speed ROIC capable of capturing the full amount of energy during the integration period, while significantly reducing bandwidth (e.g., by at least about 4 times compared to dual speed analog ROICs). The digital dual speed ROIC described herein is capable of providing a large focal plane that captures images at a high frame rate. The captured image is output as a compressed (e.g., encoded) image that reduces bandwidth (e.g., by a 4:1 reduction). The compressed output data can then be reconstructed (e.g., decoded) by a high-resolution image decoder that utilizes a targeted range of sequential data frames (e.g., the previous 8 frames of data) to obtain a high resolution image having 100% of the scene energy captured at the full frame rate.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

A module can also be established as logic embodied in hardware or firmware, or to a collection of computer readable software instructions, written in a programming language including, but not limited to, VHDL, Verilog, Java, C, or assembly, and which is executed by one or more electronic microprocessors. One or more software instructions in the modules may be embedded in firmware, such as, for example, in an EPROM, and/or stored in any type of non-transitory computer-readable medium or other storage device.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An imaging system comprising:
    a Read-Out Integrated Circuit (ROIC) configured to receive high spatial resolution imagery having a detected amount of energy from a detection device, the ROIC including a mask generator configured to apply a pixel mask to the high spatial resolution imagery so as to generate compressed high spatial resolution imagery that preserves the detected amount of energy; and
    a high-resolution image decoder in signal communication with the ROIC to receive the compressed high spatial resolution imagery, the high-resolution image decoder configured to decompress the compressed high spatial resolution imagery and obtain the high spatial resolution imagery having a detected amount of energy,
    wherein the mask generator generates the pixel mask according to a Hadamard matrix that defines a plurality of positive value measurement codes and negative value codes arranged in a plurality of rows and columns, each row indicating a frame and each column indicating a pixel with respect to the frame,
    wherein each pixel included in at least one of the rows has a positive measurement value code while excluding any negative measurement value codes.

2. The imaging system of claim 1, wherein the Hadamard matrix defines a plurality of positive value measurement codes and negative value codes arranged in a plurality of rows and columns, and wherein each column indicates a frame and each row indicates a pixel with respect to the column.

3. The imaging system of claim 2, wherein each pixel included in at least one of the columns has a positive measurement value code while excluding any negative measurement value codes.

4. The imaging system of claim 1, wherein the ROIC generates the compressed high spatial resolution imagery in response to generating a 4×2 pixel matrix for each of the rows, and summing together the positive measurement value codes to generate a first summed pixel value and summing together the negative measurement value codes to generate as second summed pixel value such that the first and second summed pixel values represent an encoded frame of the compressed high spatial resolution imagery.

5. The imaging system of claim 1, wherein the high-resolution image decoder decompresses the compressed high spatial resolution imagery in response to applying an inverse Hadamard matrix.

6. The imaging system of claim 5, wherein the inverse Hadamard matrix is applied to a sequential number of frames of the compressed high spatial resolution imagery output from the ROIC.

7. The imaging system of claim 6, wherein applying the inverse Hadamard matrix includes at least summing together the first and second summed pixel values corresponding to each frame among the sequential number of frames.

8. A method of processing imagery data comprises:
    receiving, via a Read-Out Integrated Circuit (ROIC), a high spatial resolution imagery having a detected amount of energy from a detection device;
    generating, via a mask generator, a pixel mask according to a Hadamard matrix, and applying, via the ROIC, the pixel mask to the high spatial resolution imagery so as to generate compressed high spatial resolution imagery that preserves the detected amount of energy; and
    receiving, via a high-resolution image decoder; the compressed high spatial resolution imagery;
    decompressing, via the high-resolution image decoder, the compressed high spatial resolution imagery to obtain the high spatial resolution imagery having a detected amount of energy,
    wherein the Hadamard matrix is defined as a plurality of positive value measurement codes and negative value codes arranged in a plurality of rows and columns such that each row is indicative of a frame and each column is indicative of a pixel corresponding to the frame, each pixel included in at least one of the rows having a positive measurement value code while excluding any negative measurement value codes.

9. The method of claim 8, wherein each pixel included in at least one of the columns has a positive measurement value code while excluding any negative measurement value codes.

10. The method of claim 8, further comprising:
generating, via the ROIC, the compressed high spatial resolution imagery in response to generating a 4×2 pixel matrix for each of the rows;
summing together the positive measurement value codes, via the ROIC, to generate a first summed pixel value;
summing together the negative measurement value codes, via the ROIC, to generate as second summed pixel value; and
outputting, via the ROIC, a pair of the first and second summed pixel values as an encoded frame of the compressed high spatial resolution imagery.

11. The method of claim 8, further comprising decompressing, via the high-resolution image decoder, the compressed high spatial resolution imagery in response to applying an inverse Hadamard matrix.

12. The method of claim 11, further comprising applying, via the high-resolution image decoder, the inverse Hadamard matrix to a sequential number of frames of the compressed high spatial resolution imagery output from the ROIC.

13. The method of claim 12, wherein applying the inverse Hadamard matrix includes at least summing together the first and second summed pixel values corresponding to each frame among the sequential number of frames.

* * * * *